United States Patent [19]
Blackman

[11] Patent Number: 5,936,521
[45] Date of Patent: Aug. 10, 1999

[54] PIEZO FILM SENSOR SWITCH RESPONSIVE TO BLOWING FORCES

[75] Inventor: John A. Blackman, Englewood, N.J.

[73] Assignee: T.J. Wiseman, Ltd., Englewood Cliffs, N.J.

[21] Appl. No.: 09/109,425

[22] Filed: Jul. 2, 1998

[51] Int. Cl.[6] ................................................. G08B 21/00
[52] U.S. Cl. ......................... 340/540; 310/338; 310/311; 310/339
[58] Field of Search .............................. 340/540, 825.19; 310/339, 311, 338, 354

[56] References Cited

U.S. PATENT DOCUMENTS

| | | | |
|---|---|---|---|
| 4,187,532 | 2/1980 | Naffier | 362/186 |
| 4,477,249 | 10/1984 | Ruzek, et al. | 431/253 |
| 4,615,214 | 10/1986 | Burns | 310/338 X |
| 5,174,645 | 12/1992 | Chung | 362/86 |
| 5,201,322 | 4/1993 | Henry et al. | 310/338 X |
| 5,582,478 | 12/1996 | Ambrosino | 362/234 |

OTHER PUBLICATIONS

Mike Tripoli Designs, "Candle Mechanical Detail", 1996.

Primary Examiner—Jeffery A. Hofsass
Assistant Examiner—Sihong Huang
Attorney, Agent, or Firm—Cobrin & Gittes

[57] ABSTRACT

A piezo film sensor switch or a pyro film sensor switch for an electric candle or lamp, or birthday card or birthday box. The switch is omnidirectional and includes a housing having a wall with at least one opening; a piezo film within the housing and having at least two sides, one of the sides facing the opening; and two electrical conductors each in electrical contact with a respective one of the sides of the piezo film, the piezo film being responsive to air currents of sufficient magnitude to mechanically actuate the piezo film to pass electrical current through the two electrical conductors. Pyro film may be arranged in place of the piezo film in the same manner.

8 Claims, 3 Drawing Sheets

PIEZO FILM SENSOR SWITCH RESPONSIVE TO BLOWING FORCES

BACKGROUND OF THE INVENTION

1. Field of the Invention

The present invention relates to a piezo film sensor that triggers an event in response to actuation from blowing forces.

2. Discussion of Related Art

A schematic showing the mechanical detail of an electric candle is known to the inventors from Mike Tripoli Designs, but one end of the piezo transducer is held to a wall of a housing and another end is secured to the electric cylindrical candle base, which is freely movable. Such an arrangement must account for candle movements caused from vibrations or oscillatory movements of the candle during its transport or positioning, because the weight of the candle bears directly on an end of the piezo transducer. Thus, the piezo transducer must be rigid enough to support the candle weight at its free end and yet sensitive enough to respond to stresses imparted from blowing upon the candle. On the other hand, the arrangement must be sufficiently stable prior to blowing to avoid responding to vibratory or oscillatory movements of the candle during transport and positioning. Such constraints render the design unsteady and unreliable for use in practice or additional circuitry or hardware to solve the problem.

Piezo film sensors are known conventionally as described in application specification 114–1081 (Nov. 29, 1994, Rev. D) by AMP Incorporated of Harrisburg, Pa. under the title Summary of Operating Properties: DTI-028K. The description covers electrical to mechanical conversion, mechanical to electrical conversion, pyro to electrical conversion, electrical design considerations, mechanical design considerations, and joint electrical and mechanical design considerations. Suffice it to note that the output energy from the piezo film is proportional to the volume of the film stressed.

Therefore, exerting forces on the piezo film sensor that stresses the same will generate electrical energy as output. The greater the magnitude of the force exerted, the greater the stress and the greater the energy output.

It would be desirable to arrange the components of an electric candle in such a manner that the piezo film sensor may be employed in a steady and reliable manner.

SUMMARY OF THE INVENTION

One aspect of the invention relates to a piezo film sensor switch responsive to blowing forces. The switch includes a housing having a wall with an opening; a piezo film within the housing and having two sides, one of the sides facing the opening; and two electrical conductors each in electrical contact with a respective one of the sides of the piezo film, the piezo film being responsive to air currents of sufficient magnitude to mechanically actuate the piezo film so as to pass electrical current through the two electrical conductors.

BRIEF DESCRIPTION OF THE DRAWINGS

For a better understanding of the present invention, reference is made to the following description and accompanying drawings, while the scope of the invention is set forth in the appended claims.

DESCRIPTION OF THE PREFERRED EMBODIMENT

Figure 1:
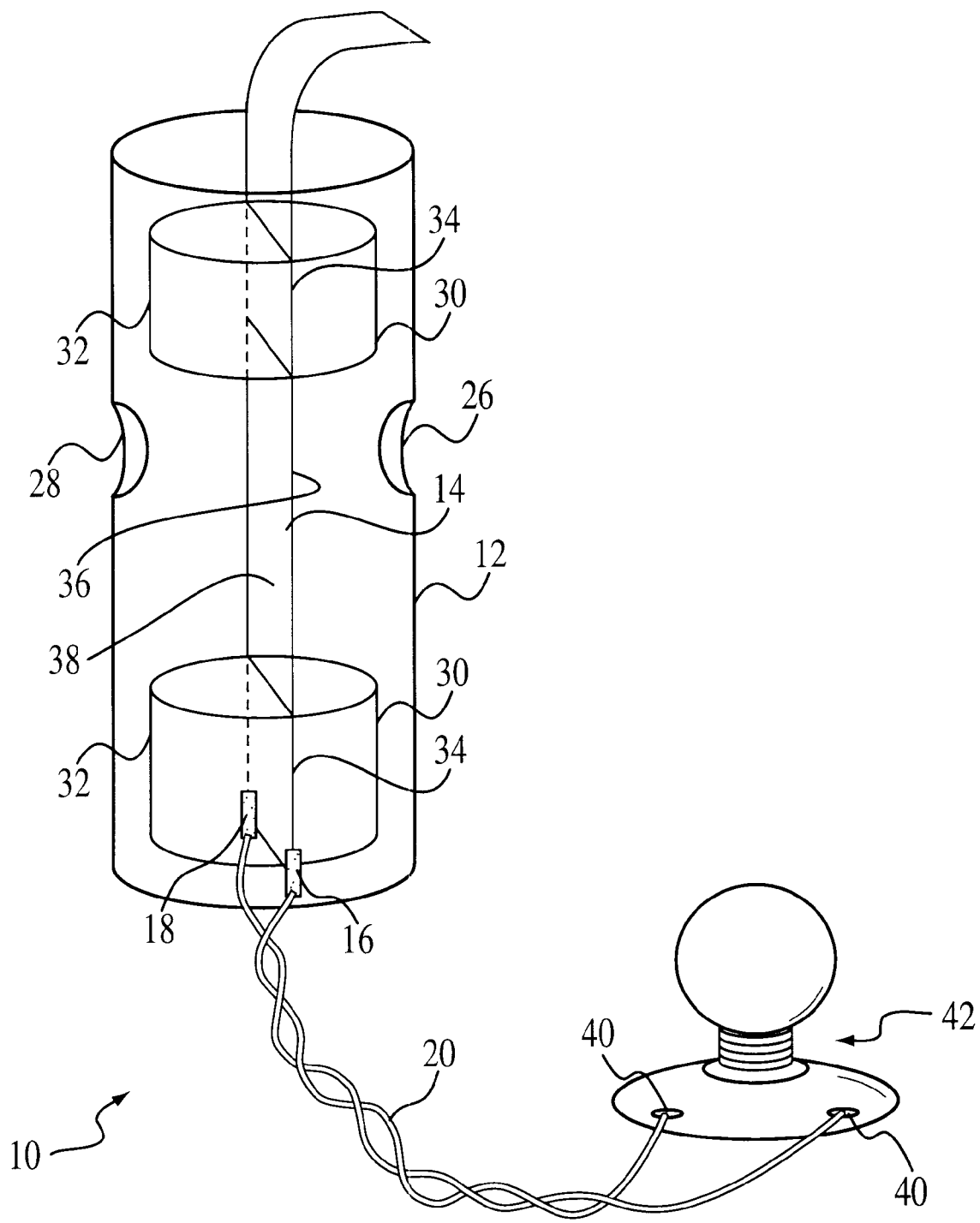
FIG. 1 is a schematic representation of an electric candle circuit with piezo film sensor in accordance with the invention.

A piezo film sensor 10 is shown that has housing 12, a piezo film 14, and electric conductors 16, 18. Wiring 20 connects the electric conductors 16, 18 with an electric candle contacts 40 of a light source 42 powered by a power source (not shown). The housing 12 has openings 26, 28 and two pairs of semicircular holders 30, 32 that define slits 34 therebetween. The film 14 is held in the slits 34 between the opposing faces of the holders 30, 32. One side 36 of the film 14 faces the opening 26 and the other side 38 faces the other opening 28. The housing may be made of plastic such as styrene.

To operate, a person blows through either of the openings 28, 30. The piezo film 14 responds by generating electrical energy between the electric conductors 16, 18. Preferably, the piezo film sensor is 28 micrometer piezo film with a dimension of 8"×5.5" and made of nickel-copper, as manufactured by AMP Incorporated of Valley Forge, Pa. under the part number 1-1003703-4. While such is preferred, piezo films of other dimensions and constructions are suitable as well, such as those listed in the Piezo Film Sensor Price List of AMP Incorporated, dated Jul. 1, 1996 Rev A or other manufacturers. The film may be obtained as a continuous roll or with a silver ink electrode pattern. Electrical connection is made by physical or adhesive techniques.

The light source 42 is triggered to cease illuminating in response to the passing of electrical current through the electric conductors 16, 18. Conventional circuitry may be connected to the light source circuitry of FIG. 1 to trigger other events, such as enunciation of audible tones to play music, such as a birthday song. The invention may be used on a birthday card, birthday present box, birthday cake box or as a lamp.

Preferably, the electric candle circuit 10 has an omnidirectional film switch, as results from a plurality of piezo films 14 each angled relative to each other and facing associated openings in the housing.

Figure 2:
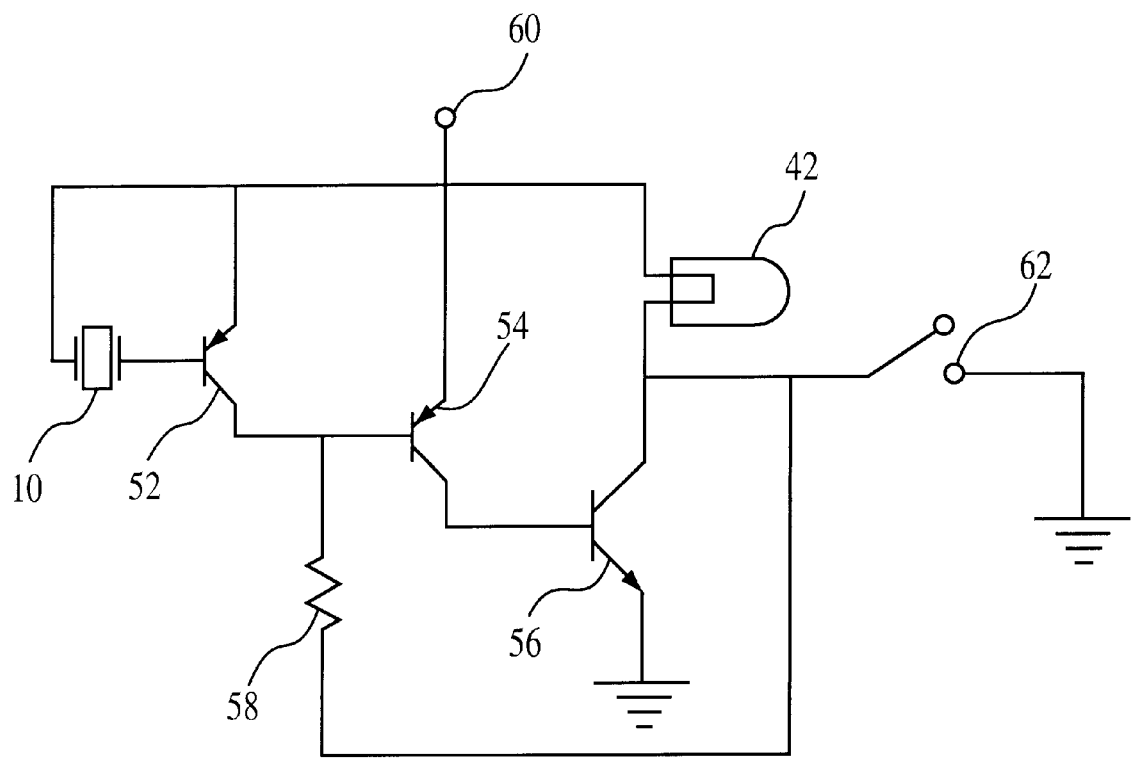
FIG. 2 is a schematic circuit diagram suitable as circuitry for the embodiment of FIG. 1 to keep the electric candle on after actuation by the piezo film sensor.

FIG. 2 shows an embodiment to turn the single light source 42 off after actuation by the piezo film sensor 10. The circuit 50 includes a light source 42 in the form of a light or LED, an electronic switching module that includes transistors 52, 54, 56 arranged as shown, a resistor 58, the Piezo film sensor 10 a AA or AAA battery 60 (permanent or replaceable) secured in a molded plastic housing unit (not shown) and momentary switch 62.

Figure 3:
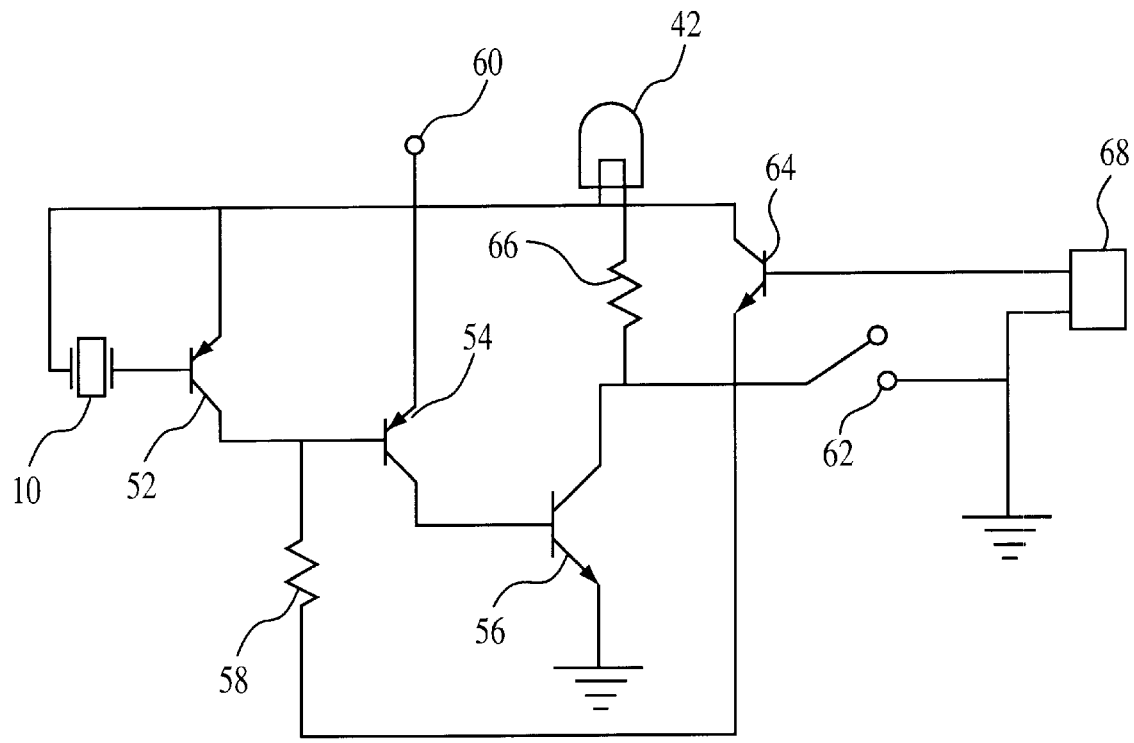
FIG. 3 is a schematic circuit diagram suitable as circuitry for the embodiment of FIG. 1 to flash the electric candle after actuation by the piezo film sensor and to generate noise.

FIG. 3 is a variation of FIG. 2 in that the single light source 42 is controlled to flash. In addition to transistors 52, 54, 56, resistor 60, piezo film sensor 10, the AA or AAA battery 60 (permanent or replaceable) secured in a molded plastic housing unit, and the momentary switch 62, there is an additional transistor 64, resistor 66 and noise generator 68 arranged as shown.

Figure 4:
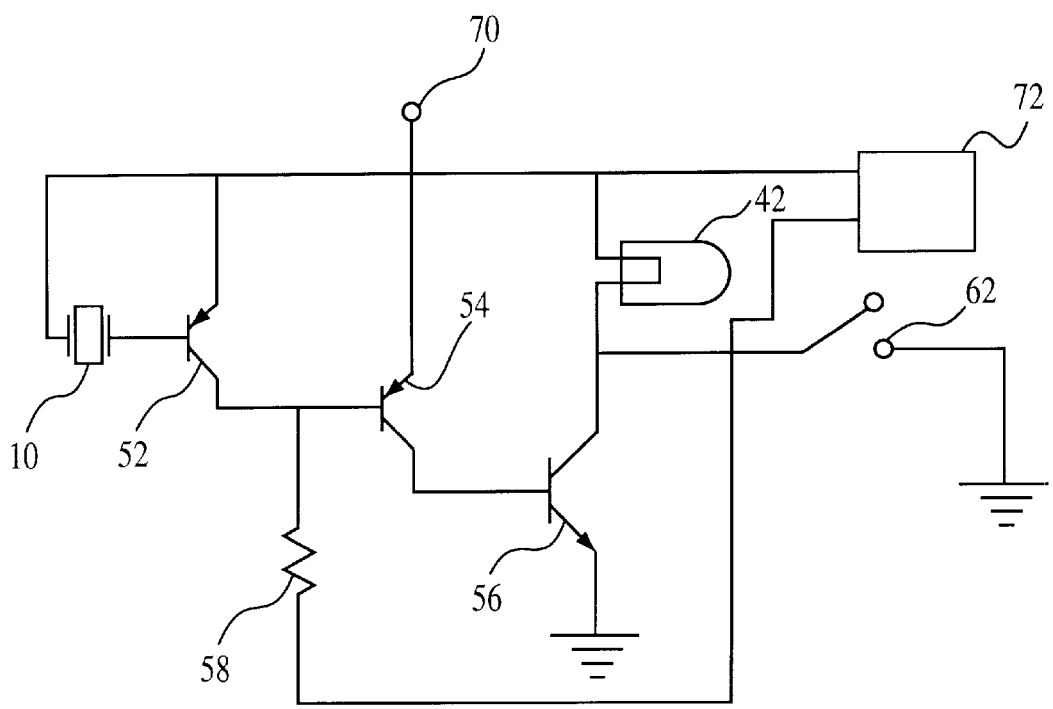
FIG. 4 is a schematic circuit diagram suitable as circuitry for the embodiment of FIG. 1 to flicker the electric candle after actuation by the piezo film sensor and to play music.

FIG. 4 is a further variation for controlling the light source 42 to flicker and to generate music such as singing sounds.

There are transistors 52, 54, 56, resistor 60, the momentary switch 62, piezo film sensor 10, three "N" cell batteries 70 (permanent or replaceable) and an inexpensive speaker 72 secured in a molded plastic housing unit, and a conventional music module 74. Alternatively, any combination of the embodiments of FIGS. 1–4 may be grouped into a centerpiece unit, which may have multiple candles with multiple light sources, multiple piezo film sensors 10, the inexpensive speaker 72 and batteries.

The embodiments of FIGS. 1–4 are actuated by the momentary switch 62 that will turn on the light (and music). The light (and music) continues to play until a sufficient puff of air is blown through the opening in the housing containing the Piezo film. This puff of air will actuate the electronic switch by turning off the light. Once the switch shuts off, the electrical current flow decreases. This makes a literal "off" button or switch unnecessary. To reuse the candle, the momentary switch is simply struck again.

As an alternative, the momentary switch 62 may be arranged to turn off the light (and music) and the piezo film sensor 10 arranged to turn on the light (and music) in response to a puff of air blown through the opening in the housing containing the piezo film. This is done by simply exchanging the location of the momentary switch 62 with the piezo film sensor 10 in the circuitry.

Instead of a piezo film, pyro electric films may be employed that are heat sensitive. The pyro electric films respond to heat to generate electric current in an analogous manner to the piezo films generating electric current in response to blowing forces. Pyro electric films are conventional and would, for instance, respond to heat generated from lighting a match. Simply replacing the piezo film shown in the various embodiments by a pyro electric film will operate satisfactorily in response to the external application of heat to the film at a temperature above room temperature.

While the foregoing description and drawings represent the preferred embodiments of the present invention, it will be understood that various changes and modifications may be made without departing from the spirit and scope of the present invention.

What is claimed is:

1. An electric candle, comprising:

an elongated housing having an elongated wall with an opening;

triggering circuitry;

a sensor within the housing and being responsive to external stimuli of sufficient magnitude to actuate the triggering circuitry wherein said external stimuli is one of the breath of a person blowing thereon and a lit match providing heat exposure thereon; and a device actuating in response to the triggering circuitry, the device being selected from a group consisting of a light source and a sound generator, the sensor being one of an elongated piezoelectric film and a pyro electric film, the sensor having two sides, the triggering circuitry including two electrical conductors each in electrical contact with a respective one of the sides of the sensor, the sensor being responsive to the external stimuli of sufficient magnitude to pass electrical current through the two electrical conductors to actuate the triggering circuitry.

2. An electric candle as in claim 1, wherein said housing has a further opening, another of the sides of film facing the further opening.

3. An electric candle as in claim 1, in combination with a plurality of piezoelectric films in the housing angled from each other with each being responsive to the external stimuli to actuate the triggering circuitry so that sensing becomes omnidirectional.

4. An electric candle as in claim 1, wherein one of the sides of the sensor faces the opening.

5. An electric candle as in claim 1, wherein the housing has two ends, the opening being arranged between the two ends.

6. A method of operating an electric candle, comprising the steps of:

exposing a sensor to external stimuli to generate a response, the external stimuli being one of a person blowing air thereon and a lit match providing heat exposure thereon, the sensor being within an elongated housing having an elongated wall with an opening; and actuating a device from the response, the device being selected from a group consisting of a light source and a sound generator, the sensor having two sides and being within the housing and being one of an elongated piezoelectric film and a pyroelectric film; the actuating including the step of passing current through two electrical conductors of triggering circuitry, the two electrical conductors each being in electrical contact with a respective one of the sides of the sensor.

7. A method as in claim 6, further comprising arranging one of the sides of the sensor to face the opening.

8. A method as in claim 6, further comprising arranging the opending between two ends of the housing.

\* \* \* \* \*